United States Patent [19]

Bennett et al.

[11] Patent Number: 5,065,366
[45] Date of Patent: Nov. 12, 1991

[54] NON-VOLATILE RAM BIT CELL

[75] Inventors: Daniel H. Bennett, Guildford; Gary L. Dodd, East Molesey; Kenelm G. D. Murray, Chiddingfold, all of United Kingdom

[73] Assignee: Hughes Microelectronics Limited, Fife, Scotland

[21] Appl. No.: 554,046

[22] Filed: Jul. 17, 1990

[30] Foreign Application Priority Data

Jul. 13, 1989 [GB] United Kingdom ............... 8916019

[51] Int. Cl.$^5$ .............................. G11C 29/00
[52] U.S. Cl. .................... 365/201; 365/185; 365/189.05; 371/21.4; 324/158 T
[58] Field of Search ............ 365/185, 228, 154, 201, 365/189.05; 371/21.4; 324/158 T

[56] References Cited

U.S. PATENT DOCUMENTS

| | | | |
|---|---|---|---|
| 4,802,166 | 1/1989 | Casagrande et al. | 371/21.4 |
| 4,833,646 | 5/1989 | Turner | 365/185 |
| 4,967,415 | 10/1990 | Tanagawa | 371/21.4 |
| 4,972,144 | 11/1990 | Lyon et al. | 324/158 T |

Primary Examiner—Joseph E. Clawson, Jr.
Attorney, Agent, or Firm—Terje Gudmestad; Jeannette M. Walder; W. K. Denson-Low

[57] ABSTRACT

A memory cell comprising a bistable latch having first and second nodes, at least two non-volatile transistors (NV1, NV2) each having a source, a drain and a control gate, the control gates being connected to the first node (NODE 1) and one of the source and drain of each transistor being connected to the second node (NODE 2), each non-volatile transistor (NV1, NV2) further having a substrate and a floating gate between the control and the substrate, and switching means (N1, N2, TG1) for enabling the transistors to be checked in circuit.

8 Claims, 2 Drawing Sheets

NON-VOLATILE RAM BIT CELL

The present invention relates to a modified nonvolatile RAM bit cell which allows fault detection in a data word prior to total bit failure.

Non-volatile RAM cells which use floating gate transistors of various types are known. Examples of such memory cells which are fabricated using silicon gate processes and wherein the transfer of charge to and from the floating gate is conducted by Fowler-Nordheim tunnelling are disclosed in European Patent application no. 89302598.1.

Although such prior art memory cells are very useful, for example in products such as odometers and elapsed time recorders where non-volatile writing is done on every increment, it is desired to enable high numbers of counts associated with such devices to be made with greater confidence by improving the reliability of the individual memory cells.

It is an aim of the present invention to provide a means of guaranteeing all non-volatile devices are perfect at production test, and that fault flagging at word level is available. Although the memory cells according to the present invention have these improvements built in, the normal non-volatile RAM operation of the cells is not affected.

According to the present invention there is provided a memory cell comprising a bistable latch having first and second nodes, at least two non-volatile transistors each having a source, a drain and a control gate, the control gates being connected to the first node and one of the source and drain of each transistor being connected to the second node, each non-volatile transistor further having a substrate and a floating gate between the control gate and the substrate, and switching means for enabling the transistors to be checked in circuit.

The provision of more than one non-volatile floating gate transistor produces a memory cell having better endurance than prior art memory cells, since if one non-volatile device should fail then the other one will suffice to prevent corruption of the data. In a preferred embodiment of the invention, all non-volatile transistors are guaranteed to fail to OFF when they are effectively disconnected from the cell.

Memory cells according to the present invention allow the non-volatile transistors to be checked periodically in circuit, and preferably the cells provide for flag indication of vulnerable words (i.e. when one of the redundant non-volatile devices has failed). An advantage of the invention is that the facility for making the aforementioned checks and for obtaining such information is introduced into a cell by adding only a few transistors to a known type of non-volatile RAM cell.

A specific embodiment of the present invention is now described purely by way of example with reference to the accompanying drawings, in which.

Figure 1:
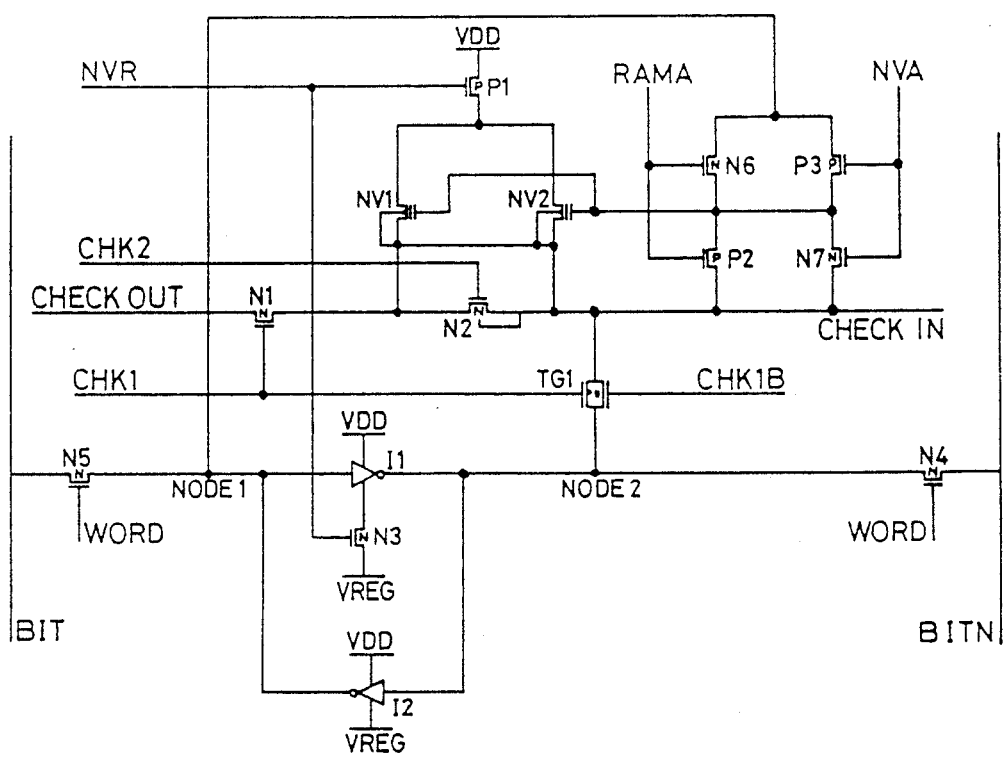
FIG. 1 shows the circuit diagram of a preferred embodiment of the invention.

With reference to FIG. 1, a modified version of a memory cell disclosed in European Patent application no. 89302598.1 is shown. Further modifications as disclosed in the European application may also be made to the memory cell of the present invention, but such modifications will not be described herein.

The circuit shown in FIG. 1 comprises a RAM latch consisting of two back-to-back inverters I1 and I2. The inverters are formed in a manner standard in the art. The latch is accessible via two pass transistors N5 and N4, which allow the latch to be both established and interrogated via data lines BIT and BITN. At the inputs of inverters I1 and I2, there are nodes NODE 1 and NODE 2 respectively.

The requirement for non-volatility is met by incorporating two transistors NV1 and NV2, capable of Fowler-Nordheim tunnelling. These transistors have floating gates, with a tunnelling region between the gate and substrate of each transistor. The substrate and source are connected together. The source of each non-volatile transistor is connected to NODE 2 via a transmission gate TG1. The drains are connected via transistor P1 to the positive voltage supply VDD. The gate of transistor P1 connects with the non-volatile read control line NVR, which also controls the gate of a further transistor N3, connected between inverter I1 and the negative supply line VREG. The gates of the non-volatile transistors NV1 and NV2 are effectively connected to NODE 1 via transistors P3 and N6 in parallel. The gate of transistor P3 connects with nonvolatile activate line NVA while the gate of transistor N6 is connected to RAM-activate control line RAMA. Further, transistors P2 and N7 are connected between the gates of the non-volatile transistors NV1, NV2 and the transmission gate TG1 (and hence NODE 2), the gate of transistor P2 being connected to RAM-activate control line RAMA and the gate of transistor N7 being connected to non-volatile activate line NVA.

Figure 2:
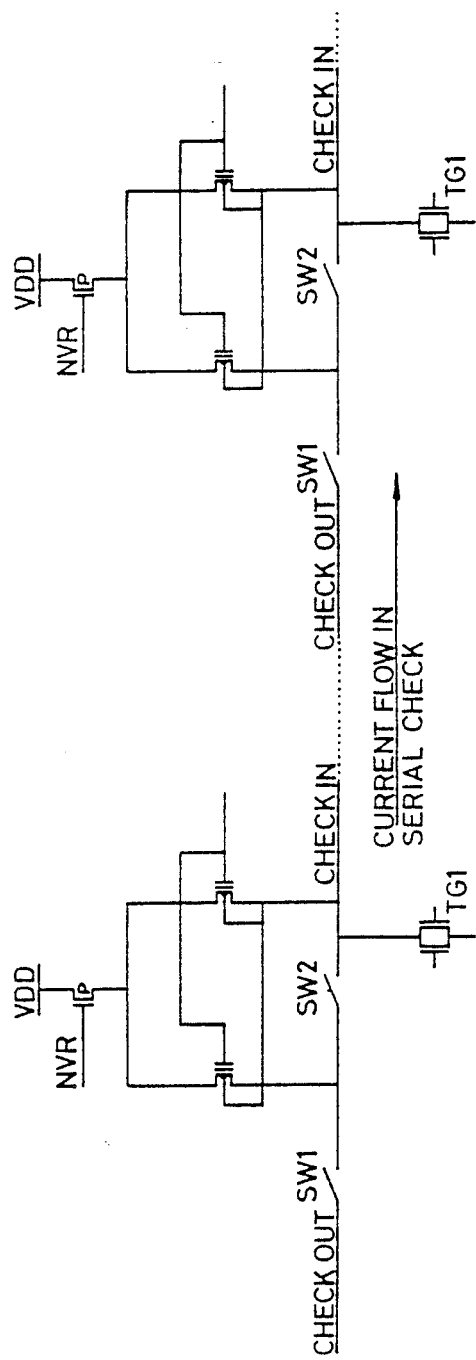
FIG. 2 shows portions of two memory cells connected in series relation.

A CHECK IN/CHECK OUT line for communication with adjacent memory cells is provided, the line incorporating two N-channel transistors N1, N2 acting as switches (SW1 and SW2 in FIG. 2). The switch N1 opens and closes the check line between adjacent memory cells, whereas the switch N2 controls the arrangement of the non-volatile transistors NV1, NV2 in either a series or a parallel relation.

The transmission gate TG1 and the switch N1 are controlled by means of an input CHK1, and the switch N2 is controlled by an input CHK2. The two inputs CHK1 and CHK2 are common to every bit in the word stored in the memory so that the switches in each memory cell open and close together.

The well connections of the non-volatile transistors are also important, ensuring that the well is always at a lower potential than the drains and sources. It should also be noted that all N-channel transistors other than the nonvolatile transistors and switch N2 have their wells connected to VREG.

When in use, a word in a non-volatile RAM array consists of several bit cells with their CHECK IN'S connected to their neighbour's CHECK OUT. Thus, when each cell's switches N1, N2 are closed, there is one common check line for the whole word (c.f. FIG. 2).

The memory cells described with reference to FIGS. 1 and 2 are designed to allow two checks to be performed on the non-volatile transistors NV1 and NV2. These two checks comprise a SERIAL check and a PARALLEL check. The SERIAL check is used to confirm that all the non-volatile devices are ON and the parallel check is used to affirm that all the non-volatile devices are OFF.

During both the SERIAL and the PARALLEL check the transmission gate TG1 is always non-conducting. Transmission gate TG1 is made non-conducting by means of an input along line CHK1.

For the SERIAL check, all switches N1 (i.e. for each memory cell) are closed and all switches N2 are open. NVR is high which turns OFF the P-channels to VDD. Now all the non-volatile transistors NV1, NV2 are connected in series. If all these devices are programmed to ON then current flow should be possible in the direction indicated in FIG. 2 (direction is important due to well connections). If such a current cannot be made to flow then it follows that at least one of the non-volatile devices is OFF and the word can be labelled as faulty. The faulty non-volatile device should not induce bit errors as the redundant transistor of the pair should continue to function.

The PARALLEL check requires that all switches N1, N2 are closed and for NVR to be low so that the P-channels are ON. Thus, CHECK IN and CHECK OUT are the same node throughout the word. If all the non-volatile devices are truly OFF then the CHECK node is independent of VDD. If, however, at least one non-volatile device is ON then the check node will be pulled up to VDD, and a fault can be flagged.

With regard to the foregoing SERIAL and PARALLEL checks, it is possible to test a memory array during production of a final product. The aim of these tests is to be absolutely certain that all transistors are working perfectly, i.e. can be turned both ON and OFF. In this regard, prior art cells were tested simply by writing/reading data; memory cells according to the present invention can be tested in a far more thorough manner using subtle tests to make sure that the fault detection mechanism in any particular device is working.

An example of tests, which can be undertaken on a memory cell as hereinbefore described with reference to FIGS. 1 and 2 of the drawings, will now be described. In this example, which refers to five-bit words, it should be understood that when the non-volatile devices in a cell are OFF then the bit is seen as storing a "1". The test proceeds as follows:

1. The word is programmed to 11111 so that all the non-volatile devices are OFF. All the switches N1, N2 are closed before trying to drive a current along the CHECK node. If a current flows then this confirms that all the switches N1, N2 can be closed. This assumes that all nonvolatile devices have been successfully programmed to OFF; later tests are used to confirm that this is the case.

2. All switches N1 are opened and all switches N2 are closed. This is the normal operating state. Program 01111 into the word and read it back. Repeat for 10111 and 11011, etc. This checks that all switches N1 can be opened. A parallel check can also be included for each pattern by toggling NVR and closing the switches N1. This shows whether the NVR controlled P-channels are working. This test implies that all non-volatile devices can be turned OFF and that all transition gates TG1 can be put into the conducting state.

3. Program the word to 10000. Close all switches N1 and drive a current along the CHECK node. Open all switches N2 and the current should stop flowing. Do the same with 01000 and 00100, etc. This decides if all switches N2 can be opened. It also implies that each non-volatile device can be turned ON.

4. Program word to 11111, such that all non-volatile devices are OFF. Set the volatile RAM half of the cell such that a high appears on the bottom of the transmission gate TG1. Close the switches N1, N2 and perform a PARALLEL check (this turns OFF the transmission gates TG1). If any one of the transmission gates TG1 is conducting, then the CHECK node will be pulled high.

By using the aforementioned tests, the condition of the switches, transmission gates and non-volatile transistors in each memory cell can be ascertained. Clearly this is advantageous, since it enables a product containing such memory cells to be manufactured with a high degree of confidence that the cells will not fail immediately upon use. In this regard, it will be noted that the cells include two non-volatile transistors, one being a backup for the other. This arrangement provides for additional reliability of the overall system and a longer life-span of the product.

Figures 3A, 3B, 3C:
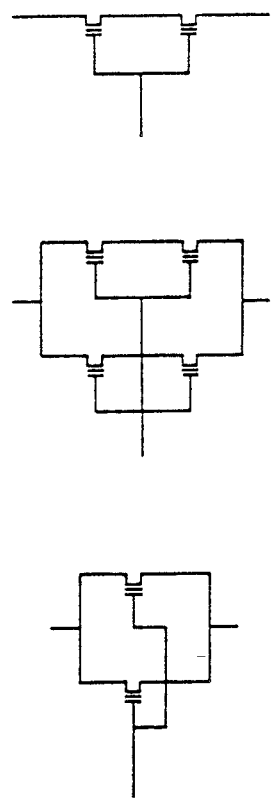
FIG. 3 shows other possible multiple non-volatile transistor configurations for use in memory cells according to the present invention.

The specific embodiment described above is purely by way of example and modifications in detail can be made within the scope of the present invention. In this regard, FIG. 3 shows two other possible non-volatile device configurations which would benefit from this type of set up. The FIG. 3C arrangement requires that the non-volatile devices fail to ON (achieved by tailoring the process parameters), while the fail state is immaterial if the arrangement shown in FIG. 3B is utilized. Memory cells incorporating the arrangements shown in FIGS. 3B and 3C could be modified readily to include fault detection facilities based on those described hereinbefore with reference to the preferred embodiment of the present invention.

We claim:

1. A memory cell, comprising:
   a bistable latch having first and second nodes;
   a first nonvolatile transistor having a source, a drain and a control gate;
   a second nonvolatile transistor having a source, a drain and a control gate;
   wherein the control gates of the nonvolatile transistors are electrically coupled to the first node and the second node is electrically coupled to one of the source and the drain of each nonvolatile transistor; and
   means for checking the nonvolatile transistors, the checking means comprising a first switch electrically coupled to the one of the source and drain of the first nonvolatile transistor; a second switch electrically coupled between the one of the source and drain of the first nonvolatile transistor and the one of the source and drain of the second nonvolatile transistor; a third switch electrically coupled between the one of the source and drain of the second nonvolatile transistor and the second node; means for enabling the first and third switches and means for enabling the second switch.

2. The memory cell of claim 1 wherein the first and second nonvolatile transistors are connected in parallel.

3. The memory cell of claim 1 wherein the first and second nonvolatile transistors are connected in series.

4. The memory cell of claim 1 wherein the third switch comprises a transmission gate.

5. The memory cell of claim 1 wherein the first and second switches comprises N-channel transistors.

6. The memory cell of claim 1 wherein the first and second nonvolatile transistors are connected in parallel, the third switch comprises a transmission gate, the sources of the first and second nonvolatile transistors are coupled to the transmission gate and the first and second switches comprises N-channel transistors.

7. A method for checking a memory cell, the memory cell comprising a bistable latch having first and second nodes; a first nonvolatile transistor having a source, a drain and a control gate; a second nonvolatile transistor having a source, a drain and a control gate; wherein the control gates of the nonvolatile transistors are electrically coupled to the first node and the second node is electrically coupled to one of the source and the drain of each nonvolatile transistor; and means for checking the nonvolatile transistors, the checking means comprising a first switch electrically coupled to the one of the source and drain of the first nonvolatile transistor; a second switch electrically coupled between the one of the source and drain of the first nonvolatile transistor and the one of the source and drain of the second nonvolatile transistor; a third switch electrically coupled between the one of the source and drain of the second nonvolatile transistor and the second node; means for enabling the first and third switches and means for enabling the second switch, comprising the steps of:

closing the first switch, opening the second and third switches;

applying a first signal to the first switch; and sampling the output at the one of the source and drain of the second nonvolatile transistor.

8. The method of claim 7 further comprising the steps of:

closing the first and second switches, opening the third switch;

applying a second signal to the first switch; and sampling the output at the one of the source and drain of the second nonvolatile transistor.

* * * * *